United States Patent
Oda et al.

(10) Patent No.: US 8,177,912 B2
(45) Date of Patent: May 15, 2012

(54) EVAPORATION SOURCE AND VACUUM EVAPORATOR USING THE SAME

(75) Inventors: Atsushi Oda, Yamagata (JP); Toshiro Kobayashi, Hiroshima (JP); Keiichi Sato, Hiroshima (JP); Hiroko Kitamoto, Hiroshima (JP); Susumu Kamikawa, Hiroshima (JP); Kozo Wada, Hiroshima (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 835 days.

(21) Appl. No.: 11/941,117

(22) Filed: Nov. 16, 2007

(65) Prior Publication Data

US 2008/0115729 A1 May 22, 2008

(30) Foreign Application Priority Data

Nov. 16, 2006 (JP) ................... 2006-309798

(51) Int. Cl.
*C23C 16/00* (2006.01)
(52) U.S. Cl. ..................... 118/726; 118/719
(58) Field of Classification Search ............ 118/726
See application file for complete search history.

(56) References Cited

U.S. PATENT DOCUMENTS

| | | | |
|---|---|---|---|
| 5,532,102 A | 7/1996 | Soden et al. | |
| 6,079,353 A * | 6/2000 | Leksell et al. | 118/715 |
| 2003/0015140 A1* | 1/2003 | Van Slyke et al. | 118/723 VE |
| 2005/0263074 A1* | 12/2005 | Masuda et al. | 118/726 |
| 2006/0130766 A1 | 6/2006 | Kim et al. | |

FOREIGN PATENT DOCUMENTS

| | | |
|---|---|---|
| DE | 3715644 A1 * | 12/1988 |
| EP | 1041169 A1 | 10/2000 |
| EP | 1418250 A2 | 10/2003 |
| JP | 8-27568 A | 1/1996 |
| JP | 2003-293120 A | 10/2003 |
| JP | 2004-137583 A | 5/2004 |
| JP | 2005-213569 A | 8/2005 |
| JP | 2006-152441 A | 6/2006 |
| WO | 03/062486 A1 | 7/2003 |

OTHER PUBLICATIONS

European Search Report dated Jul. 22, 2010, issued in corresponding European Application No. 07022102.3.
Japanese Office Action issued on Feb. 28, 2011 in corresponding Japanese Patent Application 2006-309798. Translation provided.

* cited by examiner

Primary Examiner — Karla Moore
(74) Attorney, Agent, or Firm — Westerman, Hattori, Daniels & Adrian, LLP

(57) ABSTRACT

An evaporation source having a nozzle structure that makes the distribution of film thickness uniform in the width direction of a substrate and a vacuum evaporator using the same are provided. A vapor produced by evaporation or sublimation by heating to evaporation material is discharged from a long nozzle opening like a band. A deposited substrate is transferred in a direction perpendicular to the longitudinal direction of the nozzle opening while facing the nozzle opening. A discharge flow rate of vapor per unit area in the longitudinal direction of the nozzle opening is made to be maximum in a portion at a nozzle width direction position corresponding to a substrate edge position rather than a central part of the nozzle opening and a plurality of partition plates providing directivity to the flow of vapor are arranged inside the nozzle opening.

4 Claims, 12 Drawing Sheets

EVAPORATION SOURCE AND VACUUM EVAPORATOR USING THE SAME

BACKGROUND OF THE INVENTION

1. Field of the Invention

The present invention relates to an evaporation source having a nozzle structure that is suitable for continuously forming a thin film on a deposited substrate by vapor deposition and a vacuum evaporator using the same.

2. Description of the Related Art

As is well-known, a vacuum evaporator causes a thin film to be formed by arranging an evaporation material and a deposited substrate in a vacuum chamber, melting the evaporation material by heating to cause vaporization through evaporation or sublimation, and causing the vaporized evaporation material to be deposited on the surface of a deposited substrate. Heater heating, high-frequency heating, beam heating and the like have been proposed as heating methods of the evaporation material in the above-mentioned vacuum evaporator and, though each heating method has its own special features, generally an external heating crucible method by which a vaporizing chamber (crucible) housing an evaporation material is heated by an external heater is frequently used.

Then, in recent years, by using a vacuum evaporator, vapor deposition is not limited to metallic materials, and formation of organic thin films by vapor deposition of organic substance and thin films by vapor code position using a plurality of organic substances is also performed. Accordingly, various forms, for example, a flat panel display (FPD) using an organic electroluminescence device and illumination by organic electroluminescence device used as a surface light source (luminescent panel) have been proposed.

The substrate used in the FPD and that for the luminescent panel used for illumination and the like are becoming increasingly larger in size and, in response to such trends, a vacuum evaporator using a linear evaporation source that causes a deposited substrate to be transferred in one direction and on which a long nozzle is formed in a direction perpendicular to the transfer direction of the substrate, that is, the width direction of the substrate has been provided. Accordingly, a vapor can be applied in the width direction of the substrate while the deposited substrate is transferred in one direction and therefore, an evaporated film can continuously be formed on a substrate having a relatively large area.

When the above-mentioned linear evaporation source is used to evaporate, for example, an organic material onto a substrate, it is important that the thickness of film to be evaporated is uniformly formed. However, in a vacuum evaporator using the above-mentioned linear evaporation source, it becomes difficult to form a uniform density distribution of vaporized evaporation material and an ideal flow of vapor as the whole cabinet including the vaporizing chamber housing an evaporation material becomes longer with an ever larger deposited substrate. Accordingly, the amount of evaporation on the substrate surface becomes uneven, making it difficult to obtain a uniform distribution of film thickness particularly in the width direction of the substrate.

FIG. 13 schematically shows an example of a vacuum evaporator using the above-mentioned linear evaporation source. Reference numeral 1 shows a linear evaporation source and its contour is constituted by a cabinet part 1A formed approximately like a long rectangular parallelepiped. Then, a top end of the cabinet part 1A has a rectangular opening, thereby forming a nozzle opening 2.

Though not shown in FIG. 13, a lower base part of the cabinet part 1A is similarly formed in a long shape to constitute a vaporizing chamber (crucible) in which an evaporation material is housed. Then, the whole cabinet part 1A including the vaporizing chamber is constituted in such a way that the cabinet part 1A is heated by an external heater (not shown). With this constitution, the evaporation material housed in the vaporizing chamber is vaporized or sublimated by heating and a vapor thereof is discharged like a band in a vertical direction from the nozzle opening 2.

Immediately above the nozzle opening 2, on the other hand, a deposited substrate 3 is constituted at a distance H from the upper face of the nozzle opening 2 so that the deposited substrate 3 is transferred at a constant speed in a direction indicated by an arrow A. That is, the nozzle opening 2 is arranged in such a way that its longitudinal direction is perpendicular to the transfer direction of the substrate 3, thereby enabling application of a vapor linearly (like a band) in the width direction of the substrate 3. Therefore, by transferring the deposited substrate 3 in the direction of the arrow A, evaporation can be performed continuously on the substrate 3 having a relatively large area.

A vacuum evaporator that uses a linear evaporation source as described above and performs evaporation continuously onto a deposited substrate being transferred at a constant speed has been disclosed in Japanese Patent Application Laid-Open No. 8-27568 (Patent Document 1) and Japanese Patent Application Laid-Open No. 2003-293120 (Patent Document 2).

Meanwhile, a linear evaporation source shown in the above-mentioned Patent Documents 1 and 2 embodies some constitutional devices on the assumption that it is desirable to make the flow rate of evaporated material constant (uniform) at any position in the longitudinal direction of the nozzle opening in the evaporation source in order to make the thickness of film formed on a deposited substrate uniform.

However, the present inventors have empirically found that if the distribution of flow rate of evaporated material in the longitudinal direction of the nozzle opening is made uniform, a phenomenon occurs in which the thickness of film formed on a substrate by vapor deposition becomes thinner along the width direction of the substrate toward an edge thereof. FIG. 14 illustrates a film thickness distribution thereof, and the horizontal axis shows the position in the width direction of the substrate 3 with a center C and the vertical axis shows the ratio of film thickness when the thickness of film formed in the center of the substrate 3 is set to 100.

The thickness of film formed on the basis of an idea to make the distribution of flow rate of evaporated material in the longitudinal direction of the nozzle opening uniform in the above-mentioned linear evaporation source results in, as shown in FIG. 14, a thinner edge in the width direction of a substrate. Therefore, a range (area) B1 in which the thickness of film is formed uniformly on the substrate will be narrow compared with a dimension in the width direction of the substrate.

SUMMARY OF THE INVENTION

The present invention has been made based on the above technical viewpoints and the first object is to provide an evaporation source having a nozzle structure that, by appropriately controlling the distribution of flow rate of evaporated material in the longitudinal direction of a nozzle opening, makes, as a result, the distribution of film thickness uniform in the width direction of the substrate and a vacuum evaporator using the same.

The second object of the present invention is to provide an evaporation source having a nozzle structure that can not only improve utilization efficiency of evaporation source material, but also form an evaporated film on a substrate with excellent reproducibility by providing directivity to the flow of evaporated material in a nozzle opening and a vacuum evaporator using the same.

An evaporation source according to the present invention made to attain the above objects is an evaporation source that comprises a vaporizing chamber in which an evaporation material is housed and a vapor of the evaporation material is produced by vaporization or sublimation of the evaporation material by heating and a cabinet part that communicates with the vaporizing chamber and discharges the vapor produced in the vaporizing chamber like a band through a long nozzle opening, wherein a control plate in which passage holes are formed in such a way that a discharge flow rate Q (Kg/m² sec) of vapor per unit area in the longitudinal direction of the nozzle opening becomes maximum in a portion at a nozzle width direction position corresponding to a substrate edge position rather than a central part of the nozzle opening is arranged in the cabinet part and also a plurality of partition plates providing directivity to the flow of vapor after passing through the passage holes are arranged between the control plate and the nozzle opening.

In this case, the discharge flow rate Q (Kg/m² sec) of vapor per unit area of the nozzle opening desirably has a flow rate distribution in which the discharge flow rate Q increases monotonously from a central part toward an end of the nozzle opening and, after reaching a maximum value at the position corresponding to the substrate edge position, decreases monotonously.

Then, in a preferred embodiment of the evaporation source, an arrangement pitch of the plurality of partition plates in both edge parts is set narrower, compared with that in the central part of the nozzle opening formed along the longitudinal direction.

A vacuum evaporator according to the present invention made to attain the above objects, on the other hand, comprises an evaporation source constituted as described above and a deposited substrate arranged inside a vacuum chamber, wherein the deposited substrate is transferred in a direction perpendicular to the longitudinal direction of the nozzle opening in the vacuum chamber while facing the nozzle opening of the evaporation source.

In this case, it is preferable that, if the ratio of flow rate of a discharge flow rate Q1 (Kg/m² sec) of vapor per unit area of the nozzle opening at a position facing the edge in the width direction of the deposited substrate to a discharge flow rate Q0 (Kg/m²sec) of vapor per unit area of the nozzle opening in the central part of the nozzle opening is set to be $\beta$ (=Q1/Q0), a value $\alpha$ (=$\beta$/H) obtained by dividing the $\beta$ by the distance H (m) between the upper face of the nozzle opening and the deposited substrate is set in the range of $10 \leq \alpha \leq 30$.

According to a vacuum evaporator using an evaporation source constituted as described above, a deposited substrate is transferred in the direction perpendicular to the longitudinal direction of a long nozzle opening and the discharge flow rate Q (Kg/m² sec) of vapor per unit area of the nozzle opening becomes maximum in a portion at a nozzle width direction position corresponding to the substrate edge position rather than the central part of the nozzle opening and, as a result, a control operation can be performed such that the distribution of film thickness in the width direction of the substrate becomes uniform.

Moreover, by arranging a plurality of partition plates providing directivity to the flow of vapor from the evaporation source in the above-mentioned nozzle opening, directivity can be provided to the flow of evaporated material in the nozzle opening so that it becomes possible not only to improve utilization efficiency of evaporation source material, but also to form a thin film on a substrate with excellent reproducibility.

DESCRIPTION OF THE PREFERRED EMBODIMENTS

Figure 1:
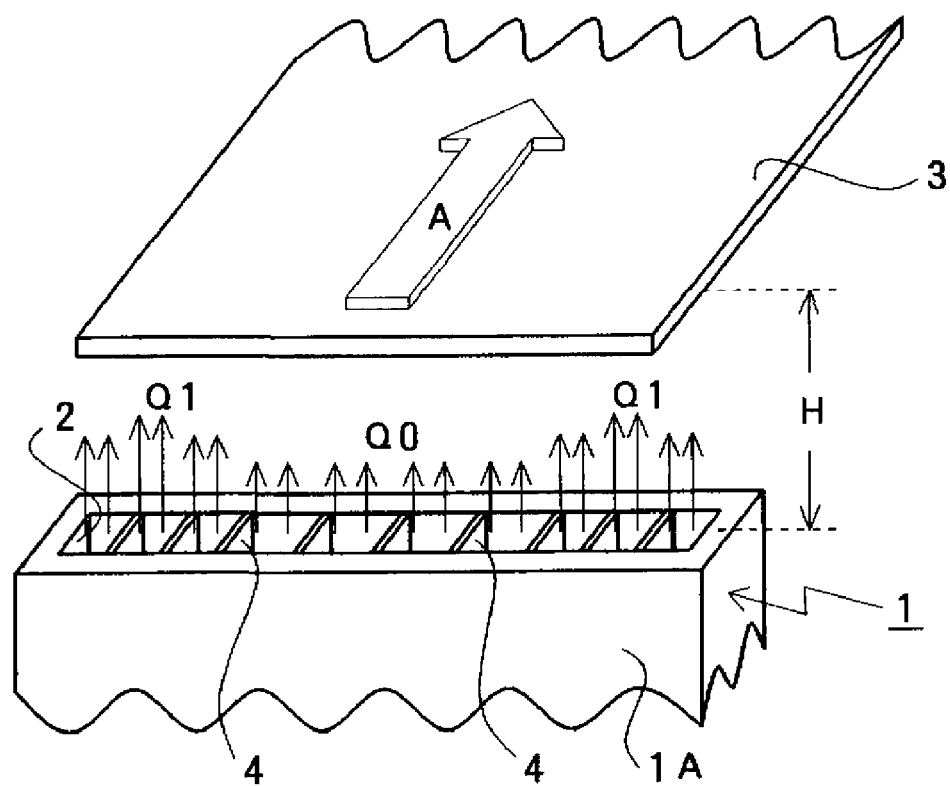
FIG. 1 is a schematic view showing a first embodiment of a vacuum evaporator according to the present invention.
Figure 2:
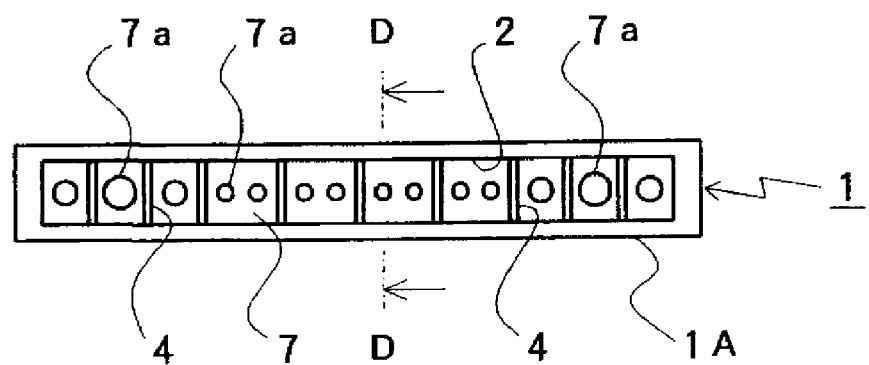
FIG. 2 is a top view when an evaporation source in FIG. 1 is viewed from immediately above a nozzle opening.
Figure 3:
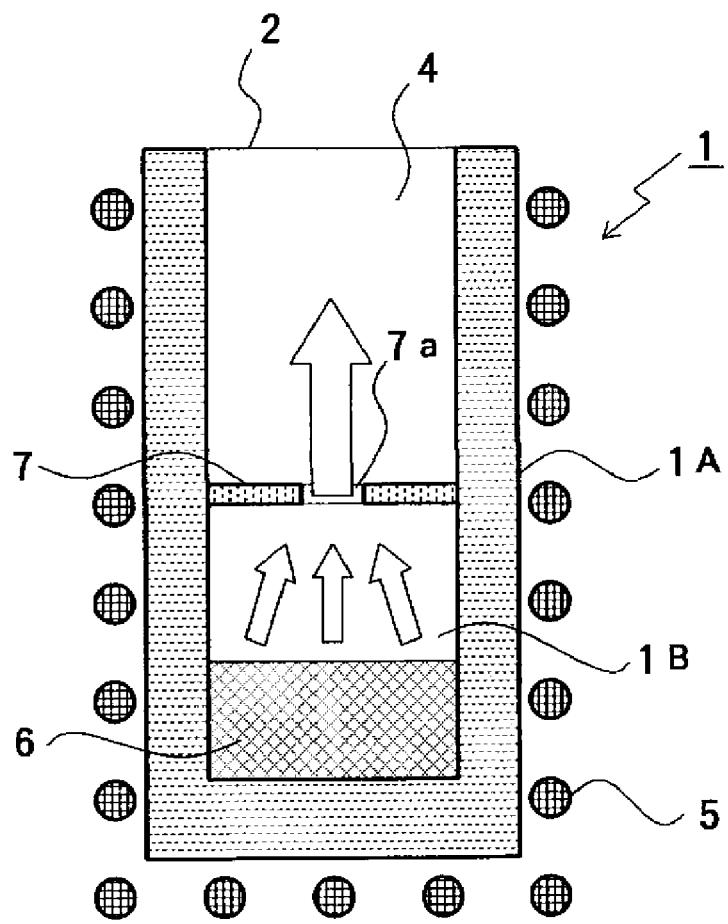
FIG. 3 is an enlarged sectional view of the evaporation source when viewed in an arrow direction from a D-D line in FIG. 2.

An evaporation source according to the present invention and a vacuum evaporator using the same will be described below on the basis of illustrated embodiments. FIG. 1 to FIG. 3 schematically show a first embodiment of a vacuum evaporator according to the present invention. FIG. 1 shows the constitution of an evaporation source and a deposited substrate that faces and is immediately above the evaporation source and is transferred in one direction, FIG. 2 is a top view when the evaporation source is viewed from immediately above a nozzle opening, and FIG. 3 shows an enlarged sectional view of the evaporation source when viewed in the arrow direction from the D-D line in FIG. 2.

Figure 13:
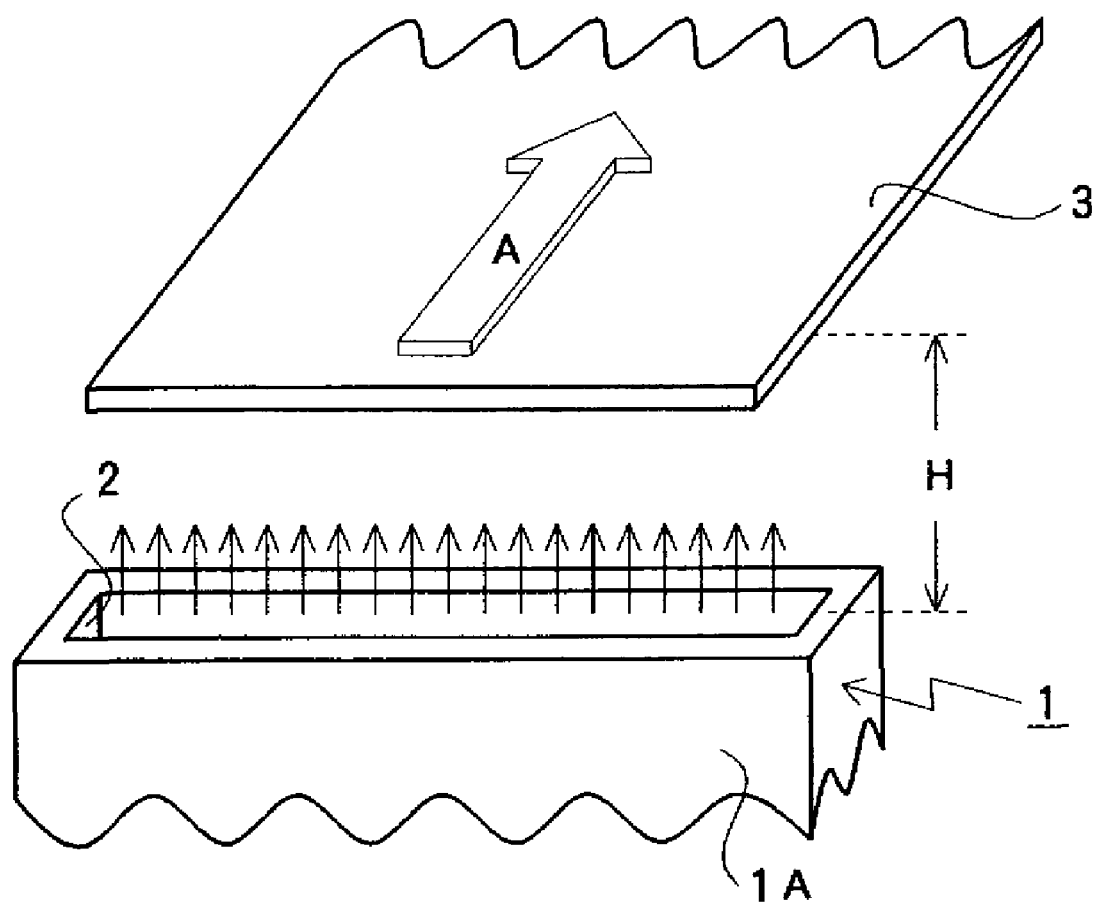
FIG. 13 is a schematic view exemplifying a conventional vacuum evaporator.

In FIG. 1, components performing similar functions to those of components described in FIG. 13 are shown with the same reference numerals. That is, reference numeral 1 shows an evaporation source and reference numeral 1A shows a long cabinet part constituting a contour of the evaporation source 1. Further, reference numeral 2 shows a rectangular nozzle opening formed at a top end of the cabinet part 1A. Moreover, reference numeral 3 shows a deposited substrate facing an upper face of the nozzle opening 2 with a distance H there between and, as already described based on FIG. 13, the deposited substrate 3 is transferred at a constant speed in the direction indicated by an arrow A.

The above-mentioned evaporation source 1 and deposited substrate 3 are arranged in a vacuum chamber (not shown) to constitute a vacuum evaporator and the deposited substrate 3 operates in such a way that, after being exposed to a vapor of evaporation material discharged from the nozzle opening 2 of the evaporation source 1 like a band, an evaporated film is continuously formed on the surface thereof.

In the evaporation source 1, as shown in FIG. 1 and FIG. 2, many partition plates 4 are arranged in the nozzle opening 2 at the top end in parallel with each other. Each surface of these partition plates 4 is arranged, as shown in these figures, intersecting at right angles to the longitudinal direction of the nozzle opening 2 and, with this constitution, the long nozzle opening 2 is partitioned into many nozzle openings with a smaller caliber by each partition plate 4 in the longitudinal direction.

A lower base part of the cabinet part 1A is formed also in a long shape, as shown in FIG. 3, to constitute a vaporizing chamber (crucible) 1B in which an evaporation material is housed. Then, the evaporation source 1 constitutes, with the whole cabinet part 1A including the vaporizing chamber 1B, a so-called hot wall chamber heated by an external heater 5. With this constitution, an evaporation material 6 housed inside the vaporizing chamber 1B is vaporized or sublimated after receiving heat and a vapor thereof is discharged in the vertical direction from the aforementioned nozzle opening 2 like a band.

Moreover, a control plate 7 is arranged horizontally between the aforementioned vaporizing chamber 1B and each partition plate 4 to partition the cabinet part 1A into upper and lower portions and, as shown in FIG. 2 and FIG. 3, the control plate 7 has many vapor passage holes 7a formed therein. As exemplified in FIG. 2, the vapor passage holes 7a in the present embodiment are formed large in the central part and small in the both edge parts.

With this constitution, as shown in FIG. 1 as an image, the discharge flow rate of vapor per unit area in the longitudinal direction of the nozzle opening 2 is controlled such that the discharge flow rate Q1 (Kg/m$^2$ sec) in the both edge parts of the nozzle opening 2 becomes higher compared with the discharge flow rate Q0 (Kg/m$^2$ sec) in the central part of the nozzle opening 2. In this case, as described in detail later, the discharge flow rate of vapor per unit area in the longitudinal direction of the nozzle opening is desirably set such that the discharge flow rate becomes maximum in a portion at a nozzle width direction position corresponding to the substrate edge position rather than the central part of the nozzle opening.

In addition, as described in detail later, the discharge flow rate of vapor per unit area of the nozzle opening desirably has a flow rate distribution in which the discharge flow rate increases monotonously from the central part toward the end of the nozzle opening and, after reaching a maximum value at the position corresponding to the substrate edge position, decreases monotonously.

The arrangement pitch of each partition plate 4 arranged between the control plate 7 having the vapor passage holes 7a formed therein and the nozzle opening 2 is set such that, as shown in FIG. 2, the arrangement pitch in the both edge parts is set narrower, compared with that in the central part of the nozzle opening 2 formed along the longitudinal direction.

That is, as shown in FIG. 2, the partition plates 4 are arranged between areas containing two vapor passage holes 7a with a small diameter in the central part of the nozzle opening 2 and between areas containing one vapor passage hole 7a with a large diameter in the both edge parts of the nozzle opening 2.

Each of the partition plates 4 operates to provide directivity to the flow of vapor inside the nozzle opening 2 after being passed through each vapor passage hole 7a and with arrangement of the aforementioned partition plates 4, a vapor after being passed through each vapor passage hole 7a is straightened so that the vapor advances inside the nozzle opening 2 with a smaller caliber partitioned by each partition plate 4 in the vertical direction. Formation efficiency of an evaporated film on the deposited substrate 3 facing immediately above the nozzle opening 2 can thereby be improved; in other words, utilization efficiency (material utilization) of the evaporation material 6 can be improved.

Figure 4:
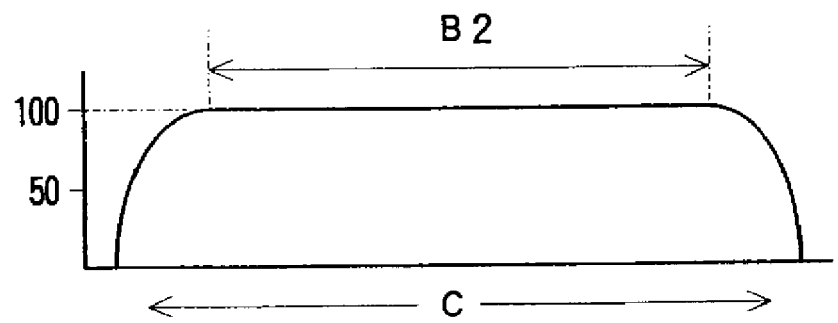
FIG. 4 is a characteristic view showing a film thickness distribution of an evaporated film formed on a deposited substrate obtained from the vacuum evaporator according to the present invention.
Figure 14:
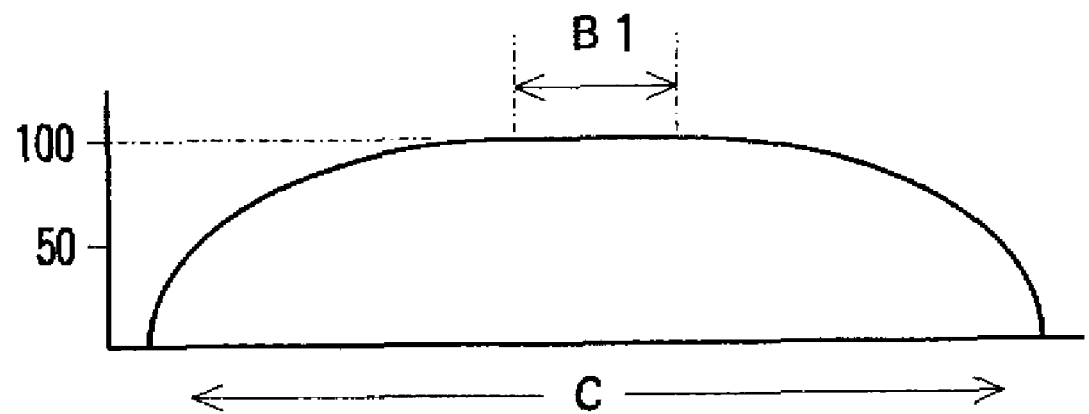
FIG. 14 is a characteristic view showing a film thickness distribution of an evaporated film formed on a deposited substrate obtained from the conventional vacuum evaporator.

FIG. 4 schematically illustrates a film thickness distribution of an evaporated film formed on the deposited substrate 3 obtained from the constitution shown in FIG. 1 to FIG. 3. In FIG. 4, like FIG. 14 already described, the horizontal axis shows the position in the width direction of the substrate 3 with the center C and the vertical axis shows the ratio of film thickness when the thickness of film formed in the center of the substrate 3 is set to 100.

According to the constitution shown in FIG. 1 to FIG. 3, as described above, the discharge flow rate of vapor per unit area in the longitudinal direction of the nozzle opening is controlled to be maximum in a portion at the nozzle width direction position corresponding to the substrate edge position rather than the central part of the nozzle opening and therefore, decrease in film thickness at an edge in the width direction of the substrate is compensated so that, as shown in FIG. 4, a range (area) B2 of film thickness formed uniformly on the substrate almost covers an entire region in the width direction of the substrate.

Further, as described above, by arranging a plurality of the partition plates 4 inside the nozzle opening 2 so that directivity is provided to the flow of vapor, reproducibility of the film thickness distribution shown in FIG. 4 can be made excellent.

Figure 5A:
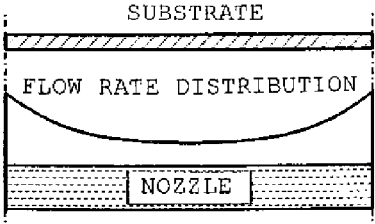
FIGS. 5A to 5H are comparative views comparing and verifying relations between the nozzle opening width with respect to the substrate width and flow rate distribution of evaporation material.
Figure 5B:
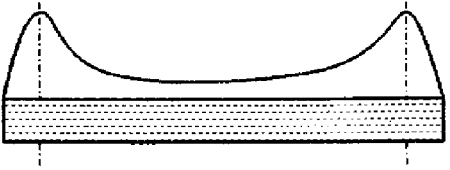
Figure 5C:
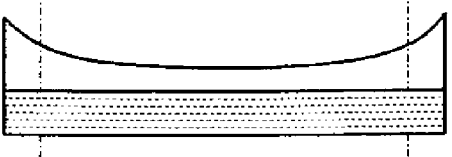
Figure 5D:
Figure 5E:
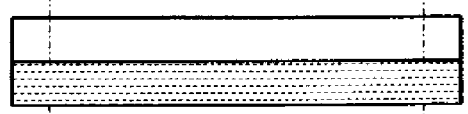
Figure 5F:
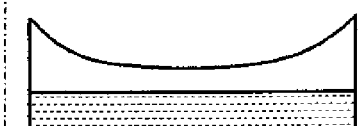
Figure 5G:
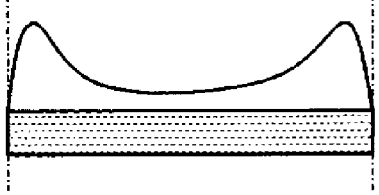
Figure 5H:
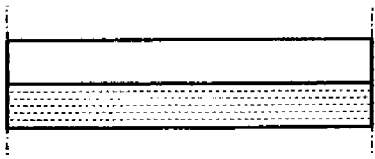

FIG. 5R to FIG. 5H show, when relations between the width of the nozzle opening 2 with respect to the width of the aforementioned deposited substrate 3 and discharge flow rate (flow rate distribution) of vapor per unit area in the longitudinal direction of the nozzle opening are variously combined, results of verification of relations between the film thickness distribution of an evaporated film formed on the substrate and evaporation material utilization (utilization efficiency of evaporation source material). Grades shown in the fields of the film thickness distribution and evaporation material utilization in FIG. 5A to FIG. 5H have the following meanings: "(double circle)" is the highest grade that means excellent, "(circle)" is the second highest grade that means good, and "(triangle)" means that the grade is "fair."

First, FIG. 5A shows an example (the invention described in claim 1) constituted in such a way that the discharge flow rate Q of vapor per unit area in the longitudinal direction of the nozzle opening becomes maximum in a portion at the nozzle width direction position corresponding to the substrate edge position rather than the central part of the nozzle opening. FIG. 5B shows an example (the invention described in claim 2) constituted in such a way that the nozzle opening is slightly wider than the substrate and the discharge flow rate Q of vapor per unit area of the nozzle opening increases monotonously from the central part toward the end of the nozzle opening and, after reaching the maximum value at the position corresponding to the substrate edge position, decreases monotonously.

In FIG. 5A, the grade of evaporation material utilization is high and also a good result is obtained in terms of film thickness distribution. In FIG. 5B, the grade is high in terms of film thickness distribution and the evaporation material utilization also produces a good result. Since the nozzle width is made larger than the substrate width in FIG. 5B compared with FIG. 5A, the temperature difference given to the substrate can be made smaller. Consequently, thermal stress given to the substrate in a vapor deposition process can be made smaller in FIG. 5B compared with FIG. 5A, reducing the degree of damage given to the substrate by the thermal stress.

Next, FIG. 5C to FIG. 5E show cases in which the maximum value of flow rate of the evaporation material is positioned outside of the substrate width and they cannot be evaluated highly in terms of evaporation material utilization. FIG. 5F to FIG. 5H show cases in which the maximum value of flow rate of the evaporation material is positioned inside of the substrate width, and they can be evaluated highly in terms of evaporation material utilization, but cannot be evaluated highly in terms of film thickness distribution.

Therefore, it is desirable from the above verification results that a vacuum evaporator according to the present invention uses an evaporation source having the flow rate distribution shown in FIG. 5A or FIG. 5B and it is particularly desirable to use an evaporation source having the flow rate distribution shown in FIG. 5B.

In the constitution shown in FIG. 1 to FIG. 3, it is desirable that the distance H between the nozzle tip (upper face of the nozzle opening 2) and the substrate 3 is set at 50 to 300 mm and, if at this point the ratio of flow rate of the discharge flow rate Q1 (Kg/m$^2$ sec) of vapor per unit area of the nozzle opening at the position facing the edge in the width direction of the substrate 3 to the discharge flow rate Q0 (Kg/m$^2$ sec) of vapor per unit area of the nozzle opening in the central part of the nozzle opening is set to be $\beta$ (=Q1/Q0), the $\beta$ is set desirably in the range shown below.

That is, if the width size of the nozzle opening 2 is 300 to 500 mm and the distance H between the nozzle tip and substrate is 100 mm, it is desirable that the ratio of flow rate $\beta$ is set at 1.8 to 1.2 in the range of 30 to 50 mm from the edge of the nozzle opening and 1.5 to 1.0 in the range of 50 to 90 mm from the edge of the nozzle opening.

Similarly, if the width size of the nozzle opening is 300 to 500 mm and the distance H between the nozzle tip and substrate is 200 mm, it is desirable that the ratio of flow rate $\beta$ is set at 3 to 2 in the range of 30 to 50 mm from the edge of the nozzle opening. That is, it is desirable to increase the value of $\beta$ as the distance H between the nozzle tip and substrate increases.

Therefore, if the relationship between the aforementioned ratio of flow rate $\beta$ and the distance H (m) between the nozzle tip and substrate is considered and the value obtained by dividing the $\beta$ by the distance H (m) is $\alpha$ ($\beta$/H), the value of $\alpha$ is desirably set in the range of $10 \leq \alpha \leq 30$. That is, if the value of $\alpha$ is less than 10, film thickness slackens at an end of the substrate, preventing a uniform film thickness distribution. If the value of $\alpha$ exceeds 30, film thickness swells at an end of the substrate, preventing a uniform film thickness distribution.

Figure 6:
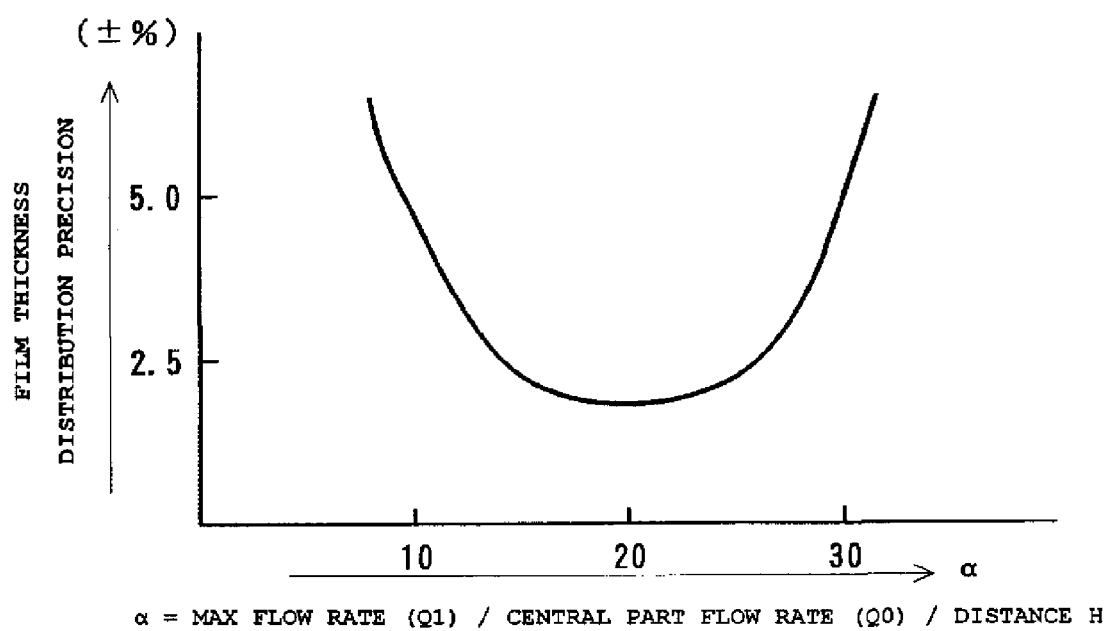
FIG. 6 is a diagram showing a preferable parameter setting range for obtaining uniform evaporated film thickness.

FIG. 6 shows a verification result of an appropriate range of the value of $\alpha$ when the range in which the film thickness falls within ±5% is regarded as a uniform film thickness, and shows that the value of $\alpha$ is desirably set in the range of 10 to 30 to obtain the aforementioned uniform film thickness.

Figure 7:
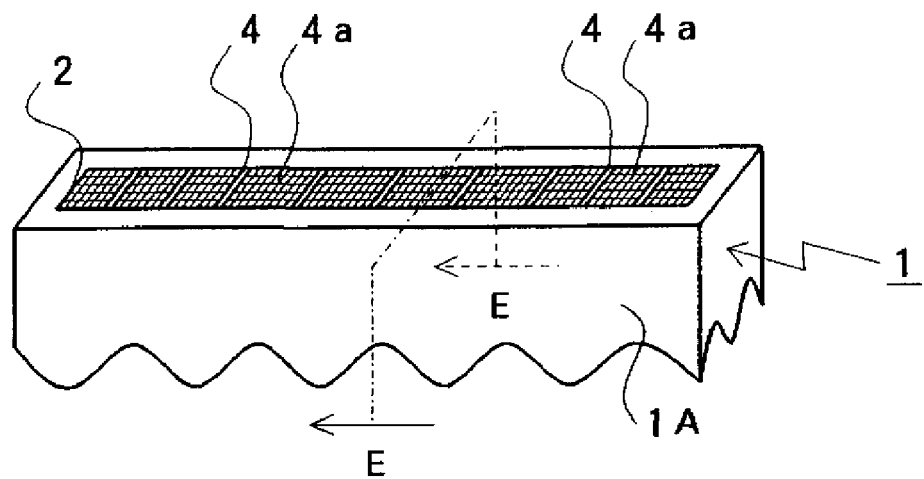
FIG. 7 is a schematic view showing a second embodiment of an evaporation source according to the present invention.
Figure 8:
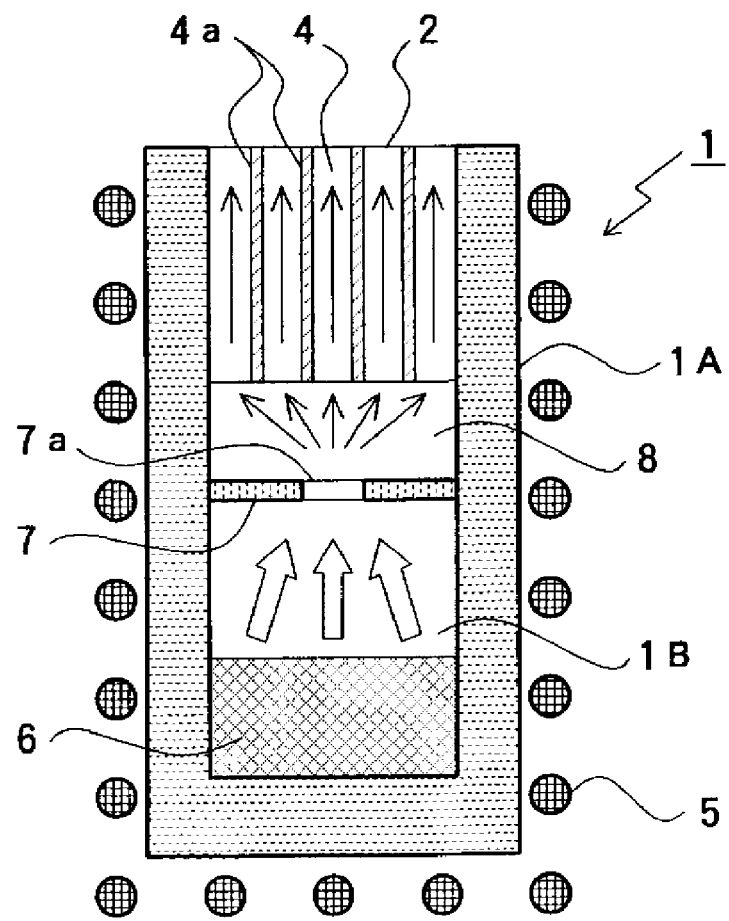
FIG. 8 is an enlarged sectional view of the evaporation source when viewed in the arrow direction from an E-E line in FIG. 7.

Next, FIG. 7 and FIG. 8 show a second embodiment of the vacuum evaporator, particularly the evaporation source according to the present invention. FIG. 7 shows an upper part of the cabinet part 1A constituting the evaporation source 1 and FIG. 8 is an enlarged sectional view of the evaporation source 1 when viewed in the arrow direction from the E-E line in FIG. 7. In FIG. 7 and FIG. 8, the same reference numerals are attached to components corresponding to components already described based on figures to omit a duplicate description.

In the present embodiment, more straightening plates 4a are arranged in vertical and horizontal directions like a grid in each nozzle opening with a smaller caliber partitioned by each partition plate 4 arranged in the nozzle opening 2 and the nozzle opening 2 is partitioned into paths of still smaller caliber by the straightening plates 4a.

Meanwhile, in the present embodiment, a space part 8 is formed between the many straightening plates 4a and the control plate 7 and a vapor from the vaporizing chamber 1B after being passed through the vapor passage holes 7a flows to rise through each of the paths formed by each straightening plate 4a using the space part 8 as a buffer.

According to the constitution of the evaporation source 1 shown in FIG. 7 and FIG. 8, with the presence of the many straightening plates 4a, directivity can further be provided to the flow of vapor discharged from the nozzle opening 2. Accordingly, it is anticipated that utilization efficiency of the evaporation source material 6 can be improved and also reproducibility of the film thickness distribution of a film formed on the deposited substrate is made better.

Figure 9:
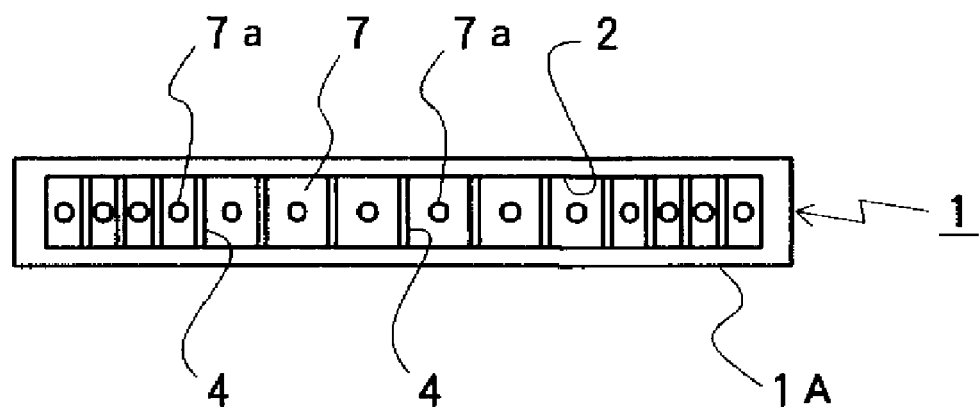
FIG. 9 is a top view showing a third embodiment of the evaporation source according to the present invention.

FIG. 9 shows a third embodiment of the vacuum evaporator, particularly the evaporation source according to the present invention and shows, like FIG. 2 already described, when the evaporation source is viewed from immediately above the nozzle opening. In the present embodiment, the control plate 7 arranged to partition the cabinet part 1A constituting the evaporation source 1 into upper and lower portions has the vapor passage holes 7a having approximately the same diameter drilled along the longitudinal direction of the control plate 7 in a line. Then, the arrangement pitch of the vapor passage holes 7a is made narrower in the both edge parts than in the central part of the control plate 7.

Then, the many partition plates 4 arranged in the nozzle opening 2 are arranged in such a way that the nozzle opening 2 is partitioned into many nozzle openings having a smaller caliber with one vapor passage hole 7a positioned in the center and, as a result, the arrangement pitch of the partition plates 4 is set such that the arrangement pitch in the both edge parts is narrower than that in the central part of the nozzle opening 2.

The evaporation source 1 of the aforementioned constitution is also controlled in such a way that the discharge flow rate of vapor per unit area in the longitudinal direction of the nozzle opening 2 becomes maximum in a portion at the nozzle width direction position corresponding to the substrate edge position rather than the central part of the nozzle opening 2 and the same operation effect as that of the embodiment shown in FIG. 1 to FIG. 3 can be attained Also in the evaporation source 1 shown in FIG. 9, as shown in FIG. 7 and FIG. 8, more straightening plates 4a can be arranged in each nozzle opening with a smaller caliber partitioned by each partition plate 4. Further, when a vacuum evaporator is constituted using the evaporation source 1 shown in FIG. 9, excellent film formation characteristics can also be obtained by setting the value $\alpha$ obtained by dividing the above ratio of flow rate β by the distance H between the nozzle tip and substrate to the aforementioned specific range.

Figure 10:
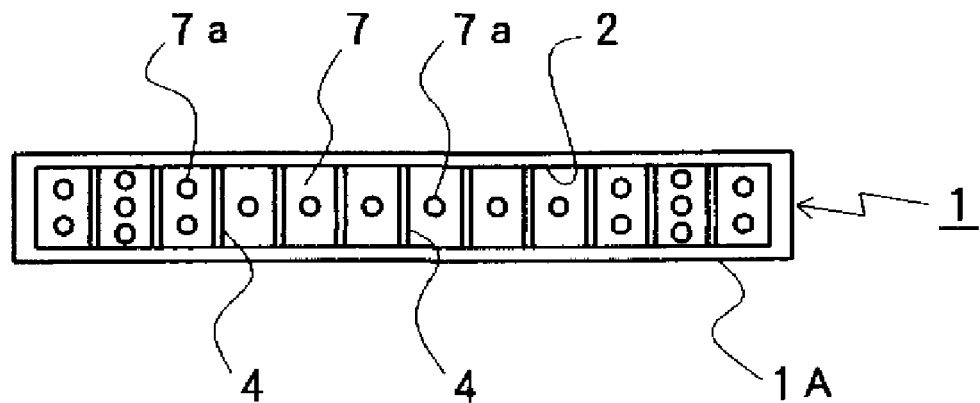
FIG. 10 is similarly a top view showing a fourth embodiment of the evaporation source.

FIG. 10 shows a fourth embodiment of the vacuum evaporator, particularly the evaporation source according to the present invention and shows, like FIG. 2 already described, when the evaporation source is viewed from immediately above the nozzle opening. In the present embodiment, the control plate 7 arranged to partition the cabinet part 1A constituting the evaporation source 1 into upper and lower portions has one vapor passage hole 7a each drilled intermittently in the central part and two or three vapor passage holes 7a are arranged concentratedly in the both edge parts in a direction perpendicular to the longitudinal direction of the control plate 7.

The evaporation source 1 of the aforementioned constitution is also controlled in such a way that the discharge flow rate of vapor per unit area in the longitudinal direction of the nozzle opening 2 becomes maximum in a portion at the nozzle width direction position corresponding to the substrate edge position rather than the central part of the nozzle opening 2 and the same operation effect as that of the embodiment shown in FIG. 1 to FIG. 3 can be attained.

Also in the evaporation source 1 shown in FIG. 10, as shown in FIG. 7 and FIG. 8, more straightening plates 4a can be arranged in each nozzle opening with a smaller caliber partitioned by each partition plate 4. Further, when a vacuum evaporator is constituted using the evaporation source 1 shown in FIG. 10, excellent film formation characteristics can also be obtained by setting the value α obtained by dividing the above ratio of flow rate β by the distance H between the nozzle tip and substrate to the aforementioned specific range.

Figure 11:
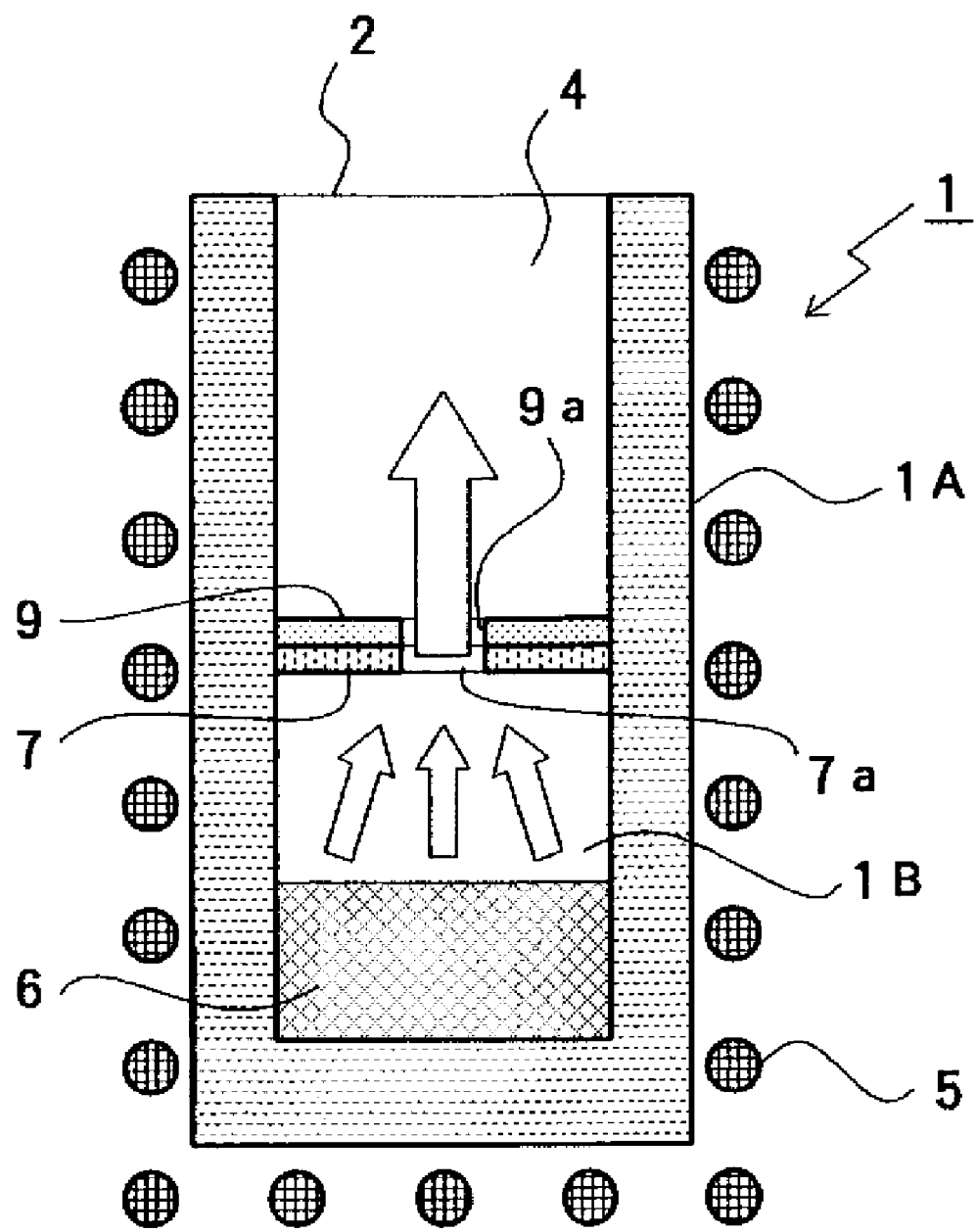
FIG. 11 is a sectional view showing the fourth embodiment of the evaporation source according to the present invention.
Figure 12A:
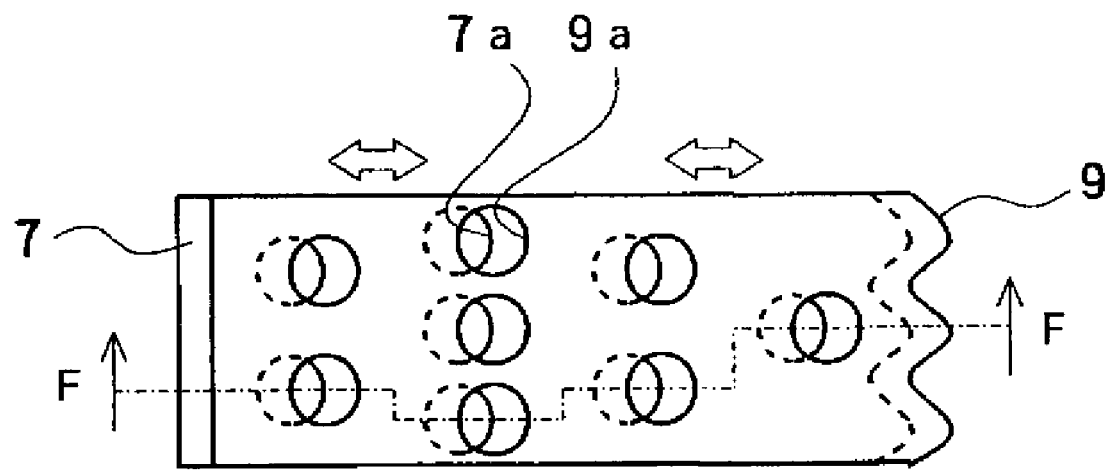
FIG. 12A is a top view illustrating an operation of a movable control plate used in the evaporation source shown in FIG. 11.
Figure 12B:
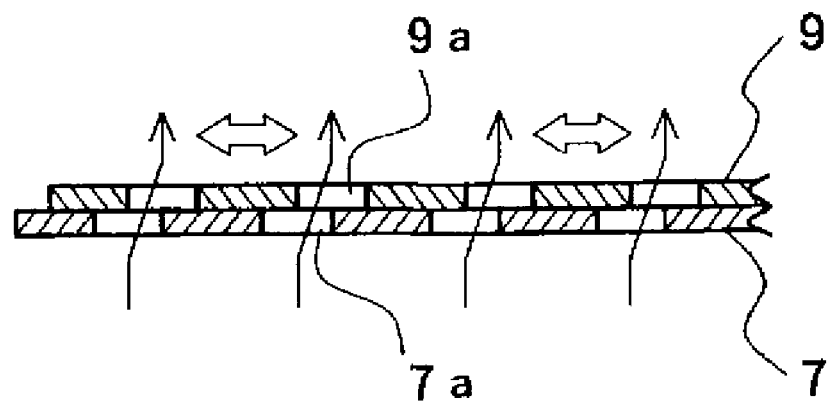
FIG. 12B is a sectional view when viewed in the arrow direction from an F-F line in FIG. 12A.

FIG. 11, FIG. 12A, and FIG. 12B show a fifth embodiment of the vacuum evaporator, particularly the evaporation source according to the present invention. FIG. 11 is, like FIG. 3 already described, a sectional view after the evaporation source is vertically cut, and FIG. 12A and FIG. 12B are a top view illustrating an operation of a movable control plate that slides by superposing on the control plate housed inside the evaporation source and a sectional view when viewed in the arrow direction from the F-F line respectively. In FIG. 11, the same reference numerals are attached to components corresponding to components already described based on FIG. 3 to omit a duplicate description.

In the present embodiment, as shown in FIG. 11, a movable control plate 9 that slides by superposing on the control plate 7 is provided on the top surface of the control plate 7. The relationship between the control plate 7 and movable control plate 9 is shown in FIG. 12A and FIG. 123 and a control plate having the vapor passage holes 7a drilled like those shown in FIG. 10 already described is used as the control plate 7 in the present embodiment.

On the other hand, the movable control plate 9 is formed long like the control plate 7 and has vapor passage holes 9a formed in a pattern similar to that of the vapor passage holes 7a formed in the control plate 7. Then, the movable control plate 9 is constituted in such a way that the movable control plate 9 is slid in the longitudinal direction along the top surface of the control plate 7, that is, in directions of arrow outlines with a blank inside. Therefore, depending on the degree of sliding in the longitudinal direction of the movable control plate 9, an opening area by the vapor passage holes 7a and 9a functions as a control valve that is controlled by similar ratios respectively.

According to the constitution provided with the aforementioned movable control plate 9, a vapor vaporized in the vaporizing chamber 1B operates to be led to the nozzle opening 2 via the control valve by means of the movable control plate 9, which can contribute to reduce irregularities of evaporation flow caused by a long vaporizing chamber.

The evaporation source 1 of the constitution shown in FIG. 11 and FIG. 12A is also controlled in such away that the discharge flow rate of vapor per unit area in the longitudinal direction of the nozzle opening 2 becomes maximum in a portion at the nozzle width direction position corresponding to the substrate edge position rather than the central part of the nozzle opening 2 and the same operation effect as that of the embodiment shown in FIG. 1 to FIG. 3 can be attained.

Also in the evaporation source 1 shown in FIG. 11 and FIG. 12A, as shown in FIG. 7 and FIG. 8, more straightening plates 4a can be arranged in each nozzle opening with a smaller caliber partitioned by each partition plate 4. Further, when a vacuum evaporator is constituted using the evaporation source 1 shown in FIG. 11 and FIG. 12A, excellent film formation characteristics can also be obtained by setting the value α obtained by dividing the above ratio of flow rate β by the distance H between the nozzle tip and substrate to the aforementioned specific range.

What is claimed is:

1. An evaporation source comprising:
   a vaporizing chamber in which an evaporation material is housed and a vapor of the evaporation material is produced by vaporization or sublimation of the evaporation material by heating and a cabinet part that communicates with the vaporizing chamber and discharges the vapor produced in the vaporizing chamber like a band through a long nozzle opening;
   a control plate arranged in the cabinet part, said control plate having passage holes formed in such a way that a discharge flow rate Q ($Kg/m^2$ sec) of the vapor per unit area in a longitudinal direction of the nozzle opening becomes maximum in a portion at a predetermined position in a nozzle width direction rather than a central part of the long nozzle opening; and
   a plurality of partition plates arranged between the control plate and the long nozzle opening in a vertical direction so that the plurality of partition plates partition the long nozzle opening into a plurality of smaller nozzle openings in the longitudinal direction such that the vapor passing through each of the passage holes provided in the control plate is straightened in the vertical direction inside each of the smaller nozzle openings; and
   wherein the discharge flow rate Q ($Kg/m^2$ sec) of the vapor per unit area of the long nozzle opening has a flow rate distribution in which the discharge flow rate Q increases monotonously from the central part toward the end of the long nozzle opening and, after reaching a maximum value at the predetermined position in the nozzle width direction, decreases monotonously.

2. The evaporation source according to claim 1, wherein an arrangement pitch of the plurality of partition plates in both edge parts of the long nozzle is set narrower, compared with that in the central part of the long nozzle opening formed along the longitudinal direction.

3. A vacuum evaporator comprising: an evaporation source as claimed in claim 1 or 2 and
   a deposited substrate arranged inside a vacuum chamber,
   wherein the deposited substrate is transferred in a direction perpendicular to the longitudinal direction of the long nozzle opening in the vacuum chamber while facing the long nozzle opening of the evaporation source, and
   wherein the discharge flow rate Q ($Kg/m^2$ sec) of the vapor per unit area of the long nozzle opening becomes maximum in a portion corresponding to a substrate edge portion.

4. The vacuum evaporator according to claim 3, wherein a ratio of flow rate of a discharge flow rate Q1 (Kg/m$^2$ sec) of vapor per unit area of the nozzle opening at the position facing the edge in the width direction of the deposited substrate to a discharge flow rate Q0 (Kg/m$^2$ sec) of vapor per unit area of the nozzle opening in the central part of the nozzle opening is β (=Q1/Q0), a value $\alpha(=\beta/H)$ obtained by dividing the β by the distance H (m) between the upper face of the nozzle opening and the deposited substrate is set in a range of $10 \leqq \alpha \leqq 30$.

* * * * *